(12) United States Patent
Chen et al.

(10) Patent No.: US 10,149,253 B2
(45) Date of Patent: Dec. 4, 2018

(54) BLOCKING INTERFERENCE SUPPRESSION METHOD AND DEVICE

(71) Applicant: DATANG MOBILE COMMUNICATIONS EQUIPMENT CO., LTD., Beijing (CN)

(72) Inventors: Xianguo Chen, Beijing (CN); Wei Lin, Beijing (CN); Shuxia Dong, Beijing (CN)

(73) Assignee: DATANG MOBILE COMMUNICATIONS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 15/311,448

(22) PCT Filed: May 25, 2015

(86) PCT No.: PCT/CN2015/079726
§ 371 (c)(1),
(2) Date: Nov. 15, 2016

(87) PCT Pub. No.: WO2015/180606
PCT Pub. Date: Dec. 3, 2015

(65) Prior Publication Data
US 2017/0086146 A1   Mar. 23, 2017

(30) Foreign Application Priority Data
May 26, 2014   (CN) ................. 2014 1 0225576

(51) Int. Cl.
*H04W 52/24*   (2009.01)
*H04W 72/04*   (2009.01)
(Continued)

(52) U.S. Cl.
CPC ........ *H04W 52/244* (2013.01); *H04B 1/1027* (2013.01); *H04W 72/0426* (2013.01);
(Continued)

(58) Field of Classification Search
CPC ........... H04W 52/244; H04W 72/0426; H04W 72/082
See application file for complete search history.

(56) References Cited

U.S. PATENT DOCUMENTS 8,116,253 B2 *   2/2012   Anderson .......... H04B 7/18543
                                                       370/318
9,337,973 B2 *   5/2016   Hou ...................... H04L 5/0035
(Continued)

FOREIGN PATENT DOCUMENTS

CN   101277121 A   10/2008
CN   101656543 A   2/2010
(Continued)

OTHER PUBLICATIONS

Sep. 2, 2015 Search Report issued in International Patent Application No. PCT/CN2015/079726.

*Primary Examiner* — Rasheed Gidado
(74) *Attorney, Agent, or Firm* — Oliff PLC

(57) ABSTRACT

A blocking interference suppression method and device, the method including: a baseband processing unit (BBU) detects blocking interference; the BBU transmits a first instruction message to a radio remote unit (RRU), the first instruction message being used to instruct the RRU to reduce the receiving link gain of the RRU. The embodiment of the present invention improves the uplink receiving performance of a TD-LTE system.

14 Claims, 6 Drawing Sheets

(51) Int. Cl.
  *H04B 1/10*   (2006.01)
  *H04W 72/08*   (2009.01)
  *H04W 88/08*   (2009.01)
  *H03G 3/30*   (2006.01)

(52) U.S. Cl.
  CPC ......... *H03G 3/3052* (2013.01); *H04W 72/082* (2013.01); *H04W 88/085* (2013.01)

(56) References Cited

U.S. PATENT DOCUMENTS

| | | | |
|---|---|---|---|
| 9,867,034 B2* | 1/2018 | Choi | H04W 8/22 |
| 2005/0075077 A1* | 4/2005 | Mach | H04B 1/1027 |
| | | | 455/67.13 |
| 2005/0147192 A1* | 7/2005 | Yamamoto | H03G 3/3052 |
| | | | 375/345 |
| 2007/0188373 A1* | 8/2007 | Shirakawa | G01S 7/023 |
| | | | 342/70 |
| 2010/0315978 A1* | 12/2010 | Satapathy | H01Q 1/246 |
| | | | 370/294 |
| 2014/0018090 A1* | 1/2014 | Khoryaev | H04W 52/04 |
| | | | 455/452.1 |
| 2016/0081046 A1* | 3/2016 | Li | H04W 72/082 |
| | | | 370/328 |
| 2016/0192181 A1* | 6/2016 | Choi | H04B 7/26 |
| | | | 455/422.1 |

FOREIGN PATENT DOCUMENTS

| | | |
|---|---|---|
| CN | 104038999 A | 9/2014 |
| WO | 2010/144292 A1 | 12/2010 |

\* cited by examiner

BLOCKING INTERFERENCE SUPPRESSION METHOD AND DEVICE

TECHNICAL FIELD

The embodiment of this invention involves the technical field of interference detection, especially a method and device for suppressing blocking interference.

BACKGROUND TECHNOLOGY

The uplink of F-band Time-Division Long-Term Evolution (TD-LTE) base stations may be subject to the downlink blocking interference, intermodulation interference, and spurious emission interference of a nearby heterogenous system base station (e.g. Global System for Mobile communication (GSM) 900, Distributed Control System (DCS) 1800, Personal Handy-phone System (PHS) base station. Therefore, signals received via TD-LTE system uplink may experience strong disturbance, which will greatly impact uplink performance of TD-LTE base stations, especially F-band. When a TD-LTE base station uplink is subject to downlink blocking interference from DCS1800/PHS base stations, its radio remote unit (RRU) receiver will enter the non-linear zone or even reach saturation, leading to rapid deterioration of uplink performance.

In existing technologies, engineering methods (e.g. antenna insulation, antenna replacement, roof adjustment, or addition of anti jamming filter) are used to address disturbance caused by heterogenous systems in certain station sites. However, in many station sites, due to workload, difficulty and impact on existing GSM network, the operators are not in favor for such engineering disturbance suppression methods. Besides, some heterogenous system disturbances originate from base stations of other operators. As different operators adopt mutually independent network configurations, it is impossible to address disturbances from base stations of other operators through engineering methods. Therefore, how to improve ability of F-band TD-LTE base stations to resist interference from a heterogenous system has become an important issue during network configuration of F-band TD-LTE.

INVENTION CONTENTS

The technical purpose of the embodiment of this invention is providing a method and device for suppressing blocking interference and improving uplink performance of TD-LTE base stations subject to interferences from a heterogenous system.

To address the above-mentioned issue, the embodiment of this invention has published a blocking interference suppression method consisting of the following steps: A base band processing unit (BBU) detects presence of blocking interference; BBU sends a first instruction message to RRU, where the first instruction message is used to instruct RRU to decrease RRU receiving link gain.

Preferably, the BBU detects presence of blocking interference. This includes the following: If in the predefined detection cycle, the average of uplink signal power values detected by BBU at each TTI moment is constantly higher than or equal to the predefined uplink receiving power upper threshold, and the uplink interference over thermal (IOT) is constantly higher than or equal to the predefined IOT upper threshold, BBU can determine that blocking interference is present.

Preferably, the first instruction message also includes the following: power attenuation parameter. This power attenuation parameter is used to instruct RRU to decrease receiving link gain step.

Preferably, before BBU sends a first instruction message to RRU, the said method also includes the following: BBU determines if the accumulated decrease of RRU receiving link gain is lower than the predefined maximum adjustment value.

Preferably, after BBU sends a first instruction message to RRU, the said method also includes the following: BBU detects that the blocking interference has been eliminated; BBU sends a second instruction message to RRU. The second instruction message is used to instruct RRU to change the receiving link gain to the default value.

Preferably, BBU detects that blocking interference has been eliminated. This includes the following: If in the predefined detection cycle, the average of uplink signal power values detected by BBU at each TTI moment is constantly lower than or equal to predefined uplink receiving power lower threshold, and the uplink interference over thermal (IOT) is constantly lower than or equal to predefined IOT lower threshold, BBU can determine that blocking interference has been eliminated.

To address the above issue, the embodiment of this invention has published a blocking interference suppression method. This includes the following: RRU receives a first instruction message from BBU. The first instruction message is sent after BBU detects presence of blocking interference; RRU decreases RRU receiving link gain.

Preferably, the first instruction message also includes the following: power attenuation parameter. The power attenuation parameter is used to instruct RRU to decrease receiving link gain step.

Preferably, after RRU decreases gain of RRU receiving link, the said method also includes the following: RRU receives a second instruction message from BBU. The second instruction message is sent by BBU after it detects that the blocking interference has been eliminated. RRU changes the receiving link gain to the default value.

To address the above issue, the embodiment of this invention has published a blocking interference suppression device, including the following: a detection unit, configured to detect presence of blocking interference; a transmission unit, configured to send a first instruction message to RRU. The first instruction message is used to instruct RRU to decrease RRU receiving link gain.

Preferably, if in the predefined detection cycle, the average of uplink signal power values detected by the detection unit at each TTI moment is constantly higher than or equal to the predefined uplink receiving power upper threshold, and the uplink interference over thermal (IOT) is constantly higher than or equal to the predefined IOT upper threshold, it can be determined that blocking interference is present.

Preferably, the said first instruction message also includes the following: power attenuation parameter. The said power attenuation parameter is used to instruct the said RRU to decrease the said receiving link gain step.

Preferably, the said blocking interference suppression device also includes the following: a determination unit, configured to determine if the accumulated decrease of RRU receiving link gain is lower than the predefined maximum adjustment value before a first instruction message is sent to RRU.

Preferably, the detection unit is also configured to detect if blocking interference has been eliminated after the first instruction message is sent to RRU; the transmission unit is also configured to send a second instruction message to the said RRU. The said second instruction message is used to instruct the said RRU to change the said receiving link gain to the default value.

Preferably, the detection unit is configured as follows: If in the predefined detection cycle, the average of uplink signal power values detected by it at each TTI moment is constantly lower than or equal to predefined uplink receiving power lower threshold, and the uplink interference over thermal (IOT) is constantly lower than or equal to predefined IOT lower threshold, it can be determined that blocking interference has been eliminated.

To address the above issue, the embodiment of this invention has published a blocking interference suppression device. This includes the following: a receiving unit, configured to receive a first instruction message from BBU, which is sent after BBU detects presence of blocking interference; and an adjustment unit, configured to decrease RRU receiving link gain.

Preferably, the said first instruction message also includes the following: power attenuation parameter. The said power attenuation parameter is used to instruct the said RRU to decrease the said receiving link gain step.

Preferably, the receiving unit is also configured to receive a second instruction message from the said BBU after the link gain of the said RRU is decreased. The said second instruction message is sent after the said BBU detects that blocking interference has been eliminated. The adjustment unit is also configured to change the said receiving link grain to the default value.

To address the above issue, the embodiment of this invention has also published a computer program, including computer readable codes. When the said computer readable codes are run in a BBU, the said BBU will execute any of the blocking interference suppression methods to be implemented with the said BBU in the claim.

To address the above issue, the embodiment of this invention has also published a computer readable medium where the claimed computer program using a BBU method to achieve blocking interference suppression is stored.

To address the above issue, the embodiment of this invention has also published a computer program, including computer readable codes. When the said computer readable codes are run in a RRU, the said RRU will execute any of the blocking interference suppression methods to be implemented with the said RRU in the claim.

To address the above issue, the embodiment of this invention has also published a computer readable medium where the claimed computer program using a RRU method to achieve blocking interference suppression is stored.

Compared with existing technologies, the embodiment of this invention provides the following advantages:

Existing technologies typically use statically configured RRU receiving link gains in TD-LTE base stations. When an F-band TD-LTE base station is exposed to blocking interference from a heterogenous system base station, if the interference intensity exceeds RRU blocking interference resistance capability, RRU receiver will enter the non-linear zone or the saturation zone, thus leading to rapid deterioration of uplink performance. In the embodiment of this invention, presence of blocking interference will dynamically decrease RRU receiving link gain and consequently RRU receiving power. As the power of signals received by RRU from the heterogenous system is reduced, the blocking interference from the heterogenous system is suppressed accordingly, thus resulting in higher uplink receiving performance of the TD-LTE system.

SPECIFIC IMPLEMENTATION

To make the above purposes, features, and advantages of the embodiments of this invention more clear and understandable, the embodiments of this invention are further described in details with figures and specific embodiments.

Existing technologies typically use statically configured RRU receiving link gains in TD-LTE base stations. When an F-band TD-LTE base station is exposed to blocking interference from a heterogenous system base station, if the interference intensity exceeds RRU blocking interference resistance capability, RRU receiver will enter the non-linear zone or the saturation zone, thus leading to rapid deterioration of uplink performance.

To address existing technical issues, the embodiment of this invention performs blocking interference detection in the full bandwidth of the uplink base band frequency domain on the TD-LTE base station (evolving node B, eNodeB) base band unit (BBU) side, and controls dynamic adjustment of receiving link gain on RRU side based on blocking interference detection information, thus suppressing blocking interference from a heterogenous system. The specific implementation process of the embodiment of this invention is described below.

First Embodiment

Figure 1:
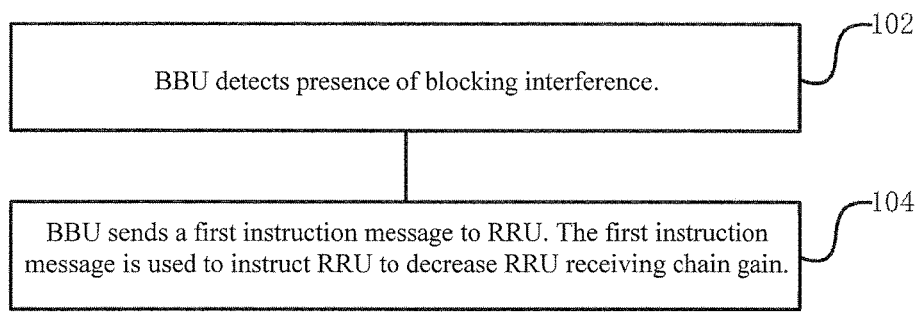
FIG. 1 gives the flow chart of a blocking interference suppression method based on the first embodiment of this invention.

FIG. 1 shows a blocking interference suppression method based on first embodiment of this invention. This method can be used in BBU of a TD-LTE system. This method includes:

Step 102: BBU detects presence of blocking interference;

BBU detects presence of blocking interference in real time. In presence of blocking interference, step 104 will be triggered. In a preferred embodiment of this invention, BBU performs detection in a predefined detection cycle. If the average of uplink signal power values detected by BBU is constantly higher than or equal to the predefined uplink receiving power upper threshold, and the uplink interference over thermal (IOT) is constantly higher than or equal to the predefined IOT upper threshold, BBU can determine that blocking interference is present. The average uplink signal power refers to the average of instantaneous power of uplink signals at each TTI moment after filtering. This embodiment helps easily determine presence of blocking interference so that receiving link gain can be adjusted in presence of such interference.

Step 104: BBU sends a first instruction message to RRU. The first instruction message is used to instruct RRU to decrease RRU receiving link gain.

During specific implementation, after determining that blocking interference is present, BBU immediately send a first instruction message to RRU, instructing it to decrease the receiving link gain. In this way, the receiving link gain can be adjusted in real time to reduce blocking interference.

BBU may detect blocking interference for a couple of times. Therefore, BBU may have already instructed RRU to decrease receiving link gain for a couple of times. In this case, a maximum adjustment value can be set. After determining presence of blocking interference, BBU first determines if the previously accumulated decrease of receiving link gain is lower than the maximum adjustment value. If this is the case, it will send a first instruction message to RRU, instructing it to decrease receiving link gain; otherwise, it will not send first instruction message to RRU. This embodiment prevents unrestricted decrease of receiving link gain.

In a preferred embodiment of this invention, BBU can determine decrease step of RRU receiving link gain, include it in the first instruction message as the power attenuation parameter, and send it to RRU. With this embodiment, BBU can control RRU adjustment step.

After BBU sends a first instruction message to RRU, if BBU detects that the blocking interference has been eliminated, BBU will send a second instruction message to RRU. The second instruction message is used to instruct RRU to change the receiving link gain to the default value. This means after blocking interference has been eliminated, RRU receiving link gain can be changed to the default value. In this way, RRU receiving function can also be improved, thus leading to better receiving efficiency and uplink performance.

In a preferred embodiment of this invention, BBU performs monitoring in a predefined detection cycle. If it detects that average of uplink signal power is constantly lower than or equal to predefined uplink receiving power lower threshold, and that uplink IOT is constantly lower than or equal to predefined IOT lower threshold, it can determine that the blocking interference has been eliminated. In this case, it can instruct RRU to change the receiving link gain to the default value.

Existing technologies typically use statically configured RRU receiving link gains in TD-LTE base stations. When an F-band TD-LTE base station is exposed to blocking interference from a heterogenous system base station, if the interference intensity exceeds RRU blocking interference resistance capability, RRU receiver will enter the non-linear zone or the saturation zone, thus leading to rapid deterioration of uplink performance. In the embodiment of this invention, presence of blocking interference will decrease RRU receiving link gain and consequently RRU receiving power. As the power of signals received by RRU from the heterogenous system is reduced, the blocking interference from the heterogenous system is suppressed accordingly, thus resulting in higher uplink receiving performance of the TD-LTE system.

Second Embodiment

Figure 2:
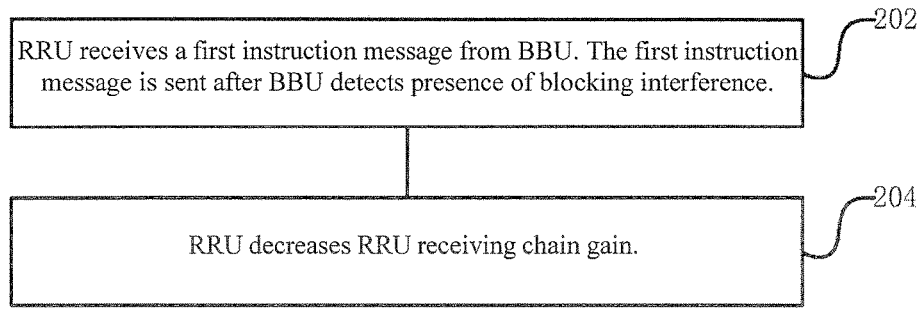
FIG. 2 the flow chart of a blocking interference suppression method based on the second embodiment of this invention.

FIG. 2 shows a blocking interference suppression method based on second embodiment of this invention. This method can be used in RRU of a TD-LTE base station. This method includes:

Step 202: RRU receives a first instruction message from BBU. The first instruction message is sent after BBU detects presence of blocking interference.

In a preferred embodiment of this invention, first instruction message includes a power attenuation parameter. The power attenuation parameter is used to instruct RRU to decrease receiving link gain step. In this way, BBU can control RRU adjustment receiving link gain step.

Step 204: RRU decreases RRU receiving link gain.

In another preferred embodiment of this invention, RRU decreases the gain of RRU receiving link, RRU receives a second instruction message from BBU. The second instruction message is sent after BBU detects that blocking interference has been eliminated. Next, RRU changes the receiving link gain to the default value.

Existing technologies typically use statically configured RRU receiving link gains in TD-LTE base stations. When an F-band TD-LTE base station is exposed to blocking interference from a heterogenous system base station, if the interference intensity exceeds RRU blocking interference resistance capability, RRU receiver will enter the non-linear zone or the saturation zone, thus leading to rapid deterioration of uplink performance. In the embodiment of this invention, presence of blocking interference will decrease RRU receiving link gain and consequently RRU receiving power. As the power of signals received by RRU from the heterogenous system is reduced, the blocking interference from the heterogenous system is suppressed accordingly, thus resulting in higher uplink receiving performance of the TD-LTE system.

Third Embodiment

Figure 3:
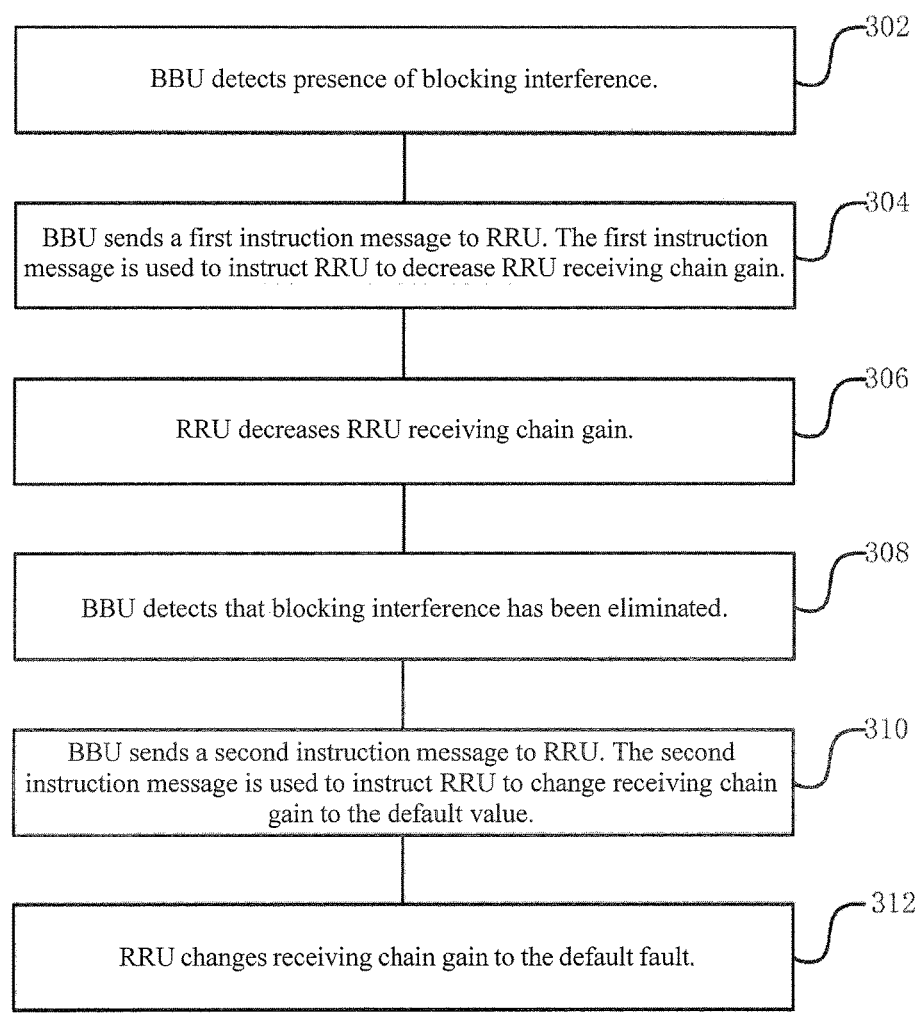
FIG. 3 the flow chart of a blocking interference suppression method based on the third embodiment of this invention.

FIG. 3 gives a flow chart of a blocking interference suppression method based on third embodiment of this invention. This method can be executed by a TD-LTE base station, as shown in FIG. 3. This method includes:

Step 302: BBU detects presence of blocking interference.

BBU monitors presence of blocking interference in real time. In case of blocking interference, step 304 will be triggered. In a preferred embodiment of this invention, BBU performs detection in the predefined detection cycle. If it detects that the average value of uplink signal power is constantly higher than or equal to predefined uplink receiving power upper threshold, and the uplink IOT is constantly higher than or equal to predefined IOT upper threshold, BBU determines that blocking interference is present. With this embodiment, it's more convenient to determine presence of blocking interference so that the receiving link gain can be adjusted in case of blocking interference.

Step 304: BBU sends a first instruction message to RRU. The first instruction message is used to instruct RRU to decrease RRU receiving link gain.

During specific implementation, after determining presence of blocking interference, BBU can immediately send a first instruction message to RRU to decrease the receiving link gain. In this way, the receiving link gain can be adjusted in real time to reduce the blocking interference.

BBU may detect blocking interference for a couple of times. Therefore, BBU may have already instructed RRU to decrease receiving link gain for a couple of times. In this case, a maximum adjustment value can be set. After determining presence of blocking interference, BBU first determines if the previously accumulated decrease of receiving link gain is lower than the maximum adjustment value. If this is the case, it will send a first instruction message to RRU, instructing it to decrease receiving link gain; otherwise, it will not send first instruction message to RRU. This embodiment prevents unrestricted decrease of receiving link gain In a preferred embodiment of this invention, BBU can determine decrease step of RRU receiving link gain, include it in the first instruction message as the power attenuation parameter, and send it to RRU. With this embodiment, BBU can control RRU adjustment step.

Step 306: RRU decreases RRU receiving link gain.

After receiving the first instruction message from BBU, RRU will decrease receiving link gain. For example, RRU decreases RRU receiving link gain using the step included in the first instruction message.

Step 308: BBU detects that blocking interference has been eliminated.

In a preferred embodiment of this invention, BBU performs monitoring in a predefined detection cycle. If it detects that average of uplink signal power is constantly lower than or equal to predefined uplink receiving power lower threshold, and that uplink IOT is constantly lower than or equal to predefined IOT lower threshold, it can determine that the blocking interference has been eliminated. In this case, it can instruct RRU to change the receiving link gain to the default value.

Step 310: BBU sends a second instruction message to RRU. The second instruction message is used to instruct RRU to change receiving link gain to the default value.

Step 312: RRU changes the receiving link gain to the default value.

After elimination of blocking interference, RRU receiving link gain can be adjusted to the default value. In this way, RRU improving function can also be improved, thus leading to higher receiving efficiency and uplink performance.

Existing technologies typically use statically configured RRU receiving link gains in TD-LTE base stations. When an F-band TD-LTE base station is exposed to blocking interference from a heterogenous system base station, if the interference intensity exceeds RRU blocking interference resistance capability, RRU receiver will enter the non-linear zone or the saturation zone, thus leading to rapid deterioration of uplink performance In the embodiment of this invention, presence of blocking interference will dynamically decrease RRU receiving link gain and consequently RRU receiving power. As the power of signals received by RRU from the heterogenous system is reduced, the blocking interference from the heterogenous system is suppressed accordingly, thus resulting in higher uplink receiving performance of the TD-LTE system.

Fourth Embodiment

Figure 4:
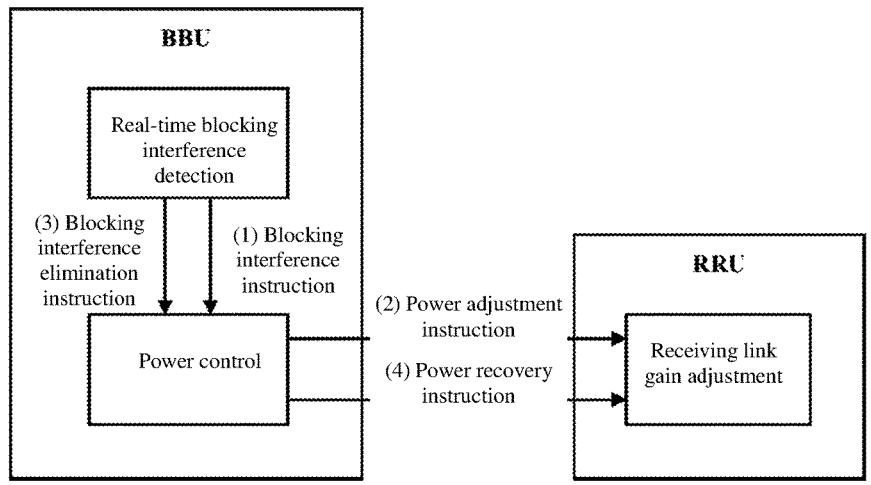
FIG. 4 is diagram of a blocking interference suppression method based on the fourth embodiment of this invention.

The embodiment of this invention also provides a blocking interference suppression method. In this method, the system performs blocking interference detection in the full bandwidth of the uplink base band frequency domain on the TD-LTE base station (evolving node C, eNodeB) BBU side, and controls dynamic adjustment of receiving link gain on RRU side based on blocking interference detection information, thus suppressing blocking interference from a heterogenous system. FIG. 4 gives a diagram of a blocking interference suppression method based on the fourth embodiment of this invention. Specific description about implementation of the embodiment of this invention is given below based on FIG. 4.

The uplink base band processing module on the BBU side (corresponding to blocking interference real-time monitoring in FIG. 4) performs real-time blocking interference detection in the full bandwidth of the frequency domain based on blocking interference characteristics. This blocking interference detection method is described below: In a defined detection cycle, if the average value of uplink signal power is constantly higher than or equal to defined uplink receiving power upper threshold, and the uplink IOT is constantly higher than or equal to the defined IOT upper threshold, presence of blocking interference can be determined Once blocking interference is detected, the uplink base band processing module will send a blocking interference instruction message to the higher-level module on the BBU side (corresponding to power control in FIG. 4). The higher-level module uses a certain power control algorithm to calculate attenuation of RRU receiving power, and sends a power adjustment instruction message to RRU corresponding to the first instruction message in the above embodiment). This message contains power attenuation parameter. The power control algorithm includes the following: If the accumulated power adjustment is lower than maximum allowed adjustment, the defined power adjustment step will be used as the RRU power attenuation.

After receiving the power adjustment indication message from BBU, RRU decreases RRU receiving link gain based on power attenuation, thus reducing power of the interfering signals entering the Analog to Digital Converter (ADC) of the receiver and suppressing blocking interference on the RRU receiver.

After RRU performs blocking interference suppression under control of BBU, the uplink base band processing module on BBU side will perform real-time blocking interference elimination detection in the full bandwidth of the frequency domain. Method for determine elimination of blocking interference: In a defined detection cycle, if the average value of uplink signal power is constantly lower than or equal to the defined uplink receiving power lower threshold, and uplink IOT is constantly lower than or equal to predefined IOT lower threshold, it can be determined that blocking interference has been eliminated.

After detection of blocking interference elimination, the uplink base band processing module sends a blocking interference elimination instruction message to the higher-level module on BBU side. Next, the higher-level module sends a power recovery instruction message to RRU (corresponding to the second instruction message in the above embodiment).

After receiving the power recovery instruction message sent by BBU, RRU recovers the RRU receiving link gain to the initial setting.

Existing technologies typically use statically configured RRU receiving link gains in TD-LTE base stations. When an F-band TD-LTE base station is exposed to blocking interference from a heterogenous system base station, if the interference intensity exceeds RRU blocking interference resistance capability, RRU receiver will enter the non-linear zone or the saturation zone, thus leading to rapid deterioration of uplink performance. In the embodiment of this invention, presence of blocking interference will dynamically decrease RRU receiving link gain and consequently RRU receiving power. As the power of signals received by RRU from the heterogenous system is reduced, the blocking interference from the heterogenous system is suppressed accordingly, thus resulting in higher uplink receiving performance of the TD-LTE system.

Fifth Embodiment

Figure 5:
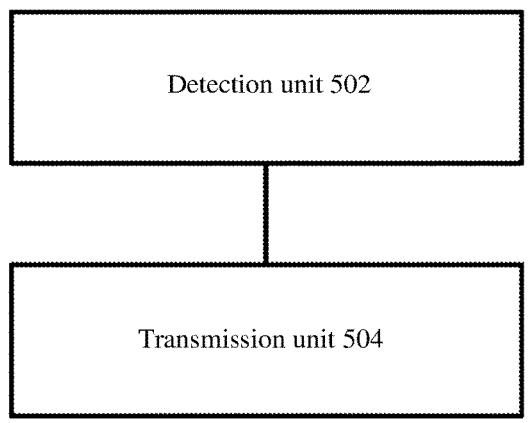
FIG. 5 is the block diagram of a blocking interference suppression device based on the fifth embodiment of this invention.

The embodiment of this invention also provides a blocking interference suppression device. This device can be BBU of a TD-LTE base station, and can be used as the BBU in the said embodiment to execute the said method. Therefore, BBU characteristics in the said method can be combined in this embodiment. FIG. 5 gives the block diagram of a blocking interference suppression device based on the fifth embodiment of this invention. This device includes the following:

Detection unit 502, configured to detects presence of blocking interference.

Transmission unit 504, configured to send a first instruction message to RRU. The first instruction message is used to instruct RRU to decrease RRU receiving link gain.

In a preferred embodiment of this invention, detection unit 502 is configured as follows: In a predefined detection cycle, if it detects that the average value of uplink signal power is constantly higher than or equal to predefined uplink receiving power upper threshold, and uplink IOT is constantly higher than or equal to predefined IOT upper threshold, it determines that blocking interference is present.

In a preferred embodiment of this invention, first instruction message also includes power attenuation parameter. The power attenuation parameter is used to instruct RRU to decrease receiving link gain step.

Figure 6:
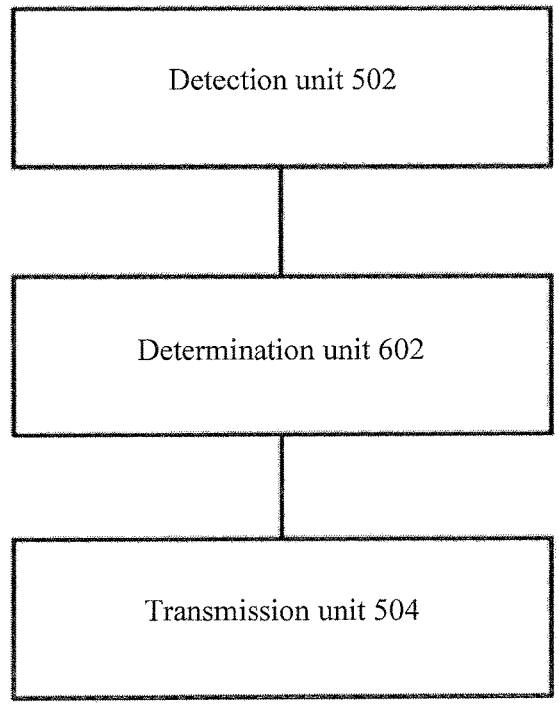
FIG. 6 is the block diagram of a preferred blocking interference suppression device based on the fifth embodiment of this invention.

FIG. 6 is the block diagram of a preferred blocking interference suppression device based on the fifth embodiment of this invention. It can be seen from FIG. 6 that this device also includes determination unit 602, which is configured to determine if accumulated decrease of RRU receiving link gain is lower than the predefined maximum adjustment before sending a first instruction message to RRU.

In a preferred embodiment of this invention, detection unit 502 is also configured to detect if blocking interference has been eliminated after sending a first instruction message to RRU. Transmission unit 504 is also configured to send a second instruction message to RRU. The second instruction message is used to instruct RRU to change receiving link gain to the default value.

In a preferred embodiment of this invention, detection unit 502 is configured as follows: In a predefined detection cycle, if it detects that the average value of uplink signal power is constantly lower than or equal to predefined uplink receiving power lower threshold, and uplink IOT is constantly lower than or equal to predefined IOT lower threshold, it determines that blocking interference has been eliminated.

Existing technologies typically use statically configured RRU receiving link gains in TD-LTE base stations. When an F-band TD-LTE base station is exposed to blocking interference from a heterogenous system base station, if the interference intensity exceeds RRU blocking interference resistance capability, RRU receiver will enter the non-linear zone or the saturation zone, thus leading to rapid deterioration of uplink performance. In the embodiment of this invention, presence of blocking interference will dynamically decrease RRU receiving link gain and consequently RRU receiving power. As the power of signals received by RRU from the heterogenous system is reduced, the blocking interference from the heterogenous system is suppressed accordingly, thus resulting in higher uplink receiving performance of the TD-LTE system.

Sixth Embodiment

Figure 7:
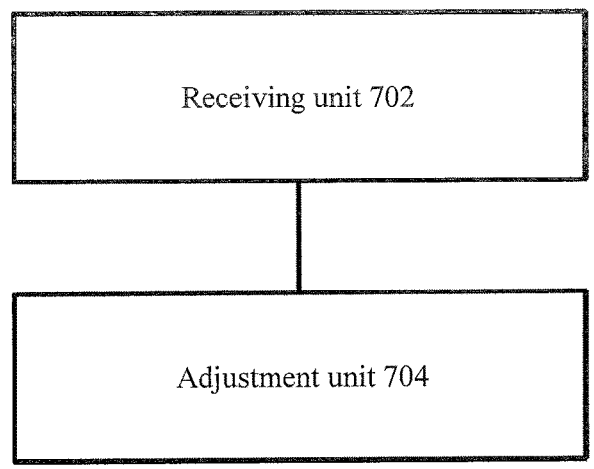
FIG. 7 is the block diagram of a blocking interference suppression device based on the sixth embodiment of this invention.

The embodiment of this invention also provides a blocking interference suppression device. This device can be RRU of a TD-LTE base station, and can be used as the RRU in the said embodiment to execute the said method. Therefore, RRU characteristics in the said method can be combined in this embodiment. FIG. 7 gives the block diagram of a blocking interference suppression device based on the sixth embodiment of this invention. This device includes the following:

Receiving unit 702, configured to receive a first instruction message from BBU. The first instruction message is sent by BBU after it detects presence of blocking interference.

Adjustment unit 704, configured to decrease RRU receiving link gain.

In a preferred embodiment of this invention, first instruction message also includes power attenuation parameter. The power attenuation parameter is used to instruct RRU to decrease receiving link gain step.

In a preferred embodiment of this invention, receiving unit 702 is also configured to receive a second instruction message from BBU after RRU receiving link gain is decreased. The second instruction message is sent after BBU detects that blocking interference has been eliminated. Adjustment unit 704 is also configured to change receiving link gain to the default value.

Existing technologies typically use statically configured RRU receiving link gains in TD-LTE base stations. When an F-band TD-LTE base station is exposed to blocking interference from a heterogenous system base station, if the interference intensity exceeds RRU blocking interference resistance capability, RRU receiver will enter the non-linear zone or the saturation zone, thus leading to rapid deterioration of uplink performance. In the embodiment of this invention, presence of blocking interference will dynamically decrease RRU receiving link gain and consequently RRU receiving power. As the power of signals received by RRU from the heterogenous system is reduced, the blocking interference from the heterogenous system is suppressed accordingly, thus resulting in higher uplink receiving performance of the TD-LTE system.

All embodiments in this specification are described progressively. Description of each embodiment focuses on differences with other embodiments, while common and similar elements can be shared between them. Description of system embodiments is simple as they are quite similar to method embodiments. Relevant details can be found in the corresponding description about method embodiments.

The algorithms and demonstrations given here are not intrinsically associated with any particular computer, virtual system, or other device. All general-purpose system can be used in conjunction with demonstrations here. Based on the above descriptions, architectures for constructing such a system are apparent. In addition, this invention is not dependent on any particular programming language. It is understandable that various programming languages can be used to realize contents of this invention described herein, and that the above descriptions concerning specific languages are intended to reveal the best implementation of this invention.

This specification provides a lot of details. However, it is understandable that embodiments of this invention can be applied in practice without such details. Some embodiments do not describe commonly known methods, structures, and technologies in details to avoid vague understanding of this specification.

Similarly, it is understandable that to simplify this publication and to help understand one or more aspects of this invention, in the above descriptions about demonstrative embodiments of this invention, different features of this invention have been sometimes grouped into a single embodiment, figure, or description. However, the published method should not be interpreted as a reflection of the following intent: the claimed invention requires more features than those explicitly recorded in each claim, or more exactly as reflected in the following claim, the features of the invention should not be fewer than all features of any single embodiment published early. Therefore, claims in line with a specific embodiment are hereby incorporated into that embodiment explicitly, where each claim itself is regarded as a separate embodiment of this invention.

It is understandable to technical personnel in this field that the modules in an embodiment device can be changed adaptively and set in one or more devices other than the embodiment one. The modules, units, or components in an embodiment can be combined into one module, unit, or component, and they can also be divided into multiple sub-modules, sub-units, or sub-components. Except for such features and/or processes or cases where at least some of the units are mutually exclusive, any combination of all features published by this specification (including accompanying claims, abstracts, and figures) and any method or all processes or units of the device published in such a way is possible. Unless otherwise stated explicitly, each feature published in this specification (including accompanying claims, abstracts, and figures) can be replaced by a substitute feature that provides the same, equivalent, or similar purpose.

Also, it is understandable to technical personnel in this field that although some embodiments described herein contain some features rather than others from other embodiments, different embodiment feature combinations means creation of different embodiments in the range this invention. For example, in the following claim, any of the claimed embodiments can be combined in any means for use.

The different part embodiments of this invention can be realized with hardware, or with software modules operated in one or more processors, or with a combination of both. It is understandable to technical personnel in this field that micro-processors or digital signal processors (DSP) can be used in practice to realize some or all functions of some or all parts in a blocking interference suppression device based on the embodiment of this invention. This invention can also realize some or all devices or device programs (e.g. computer programs and computer program products) used to execute the methods described herein. The programs realized in such a way based on this invention can be stored in a computer readable medium, or take one or more signal forms. Such signals can be downloaded from Internet websites, or provided as carrier signals or in any other forms.

Figure 8:
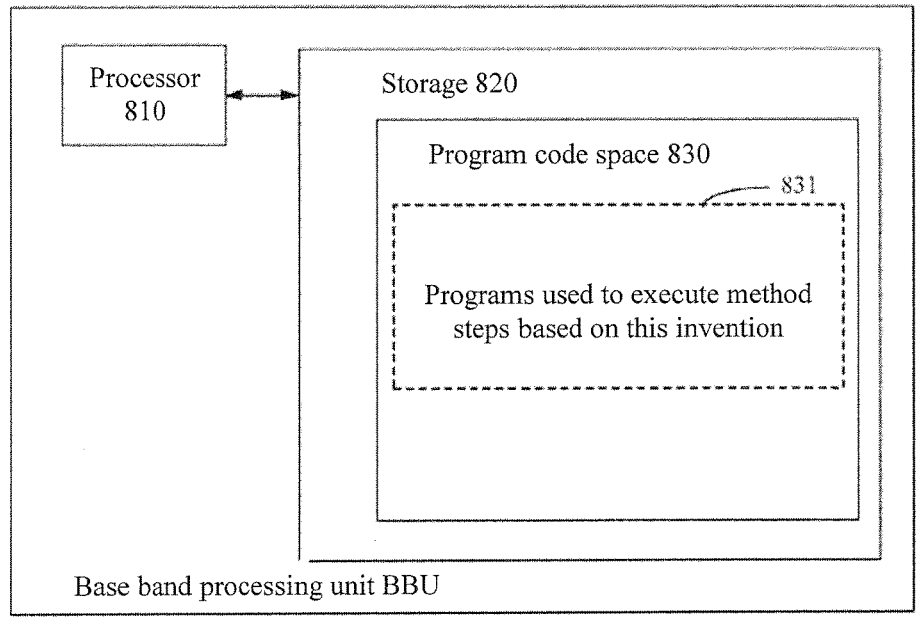
FIG. 8 is the block diagram of a BBU used to execute blocking interference suppression method based on the embodiment of this invention.
Figure 9:
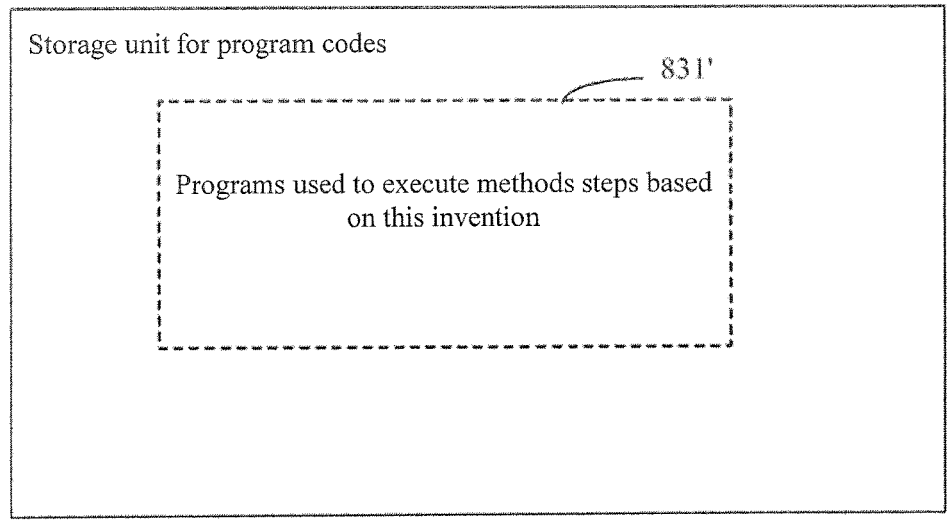
FIG. 9 is the diagram of a storage unit used to maintain or carry program codes for implementing blocking interference suppression method with BBU based on the embodiment of this invention.

FIG. 8 is the block diagram of a BBU used for performing blocking interference suppression method based on the embodiment of this invention. This BBU traditionally includes processor 810 and computer program products or computer readable medium in the form of storage 820. Storage 820 can be a flash, EEPROM (electrically erasable programmable read-only memory), EPROM, hard drive, ROM, or other electronic storage device. Storage 820 provides a storage space 830 for executing program codes 831 of any steps in the above method. For example, the storage space 830 used for program codes can include individual program codes 831 for realizing different steps in the above method. Such program codes can be read out from one or more computer program products or written into the current product or multiple computer program products. Such computer program products include program code carriers such as hard drive, compact disk (CD), storage card, or floppy disk. Such computer program products are typically portable or immobile storage units as depicted in FIG. 9. Such storage units can have storage segments and space that are similar to those in the storage 820 of the base station in FIG. 8. The program codes can, e.g. be compressed in an appropriate form. Typically, the storage units contain computer readable codes 831, which are codes readable to processors such as 810. When such codes are executed by a BBU, BBU will execute different steps in the above-mentioned method.

Figure 10:
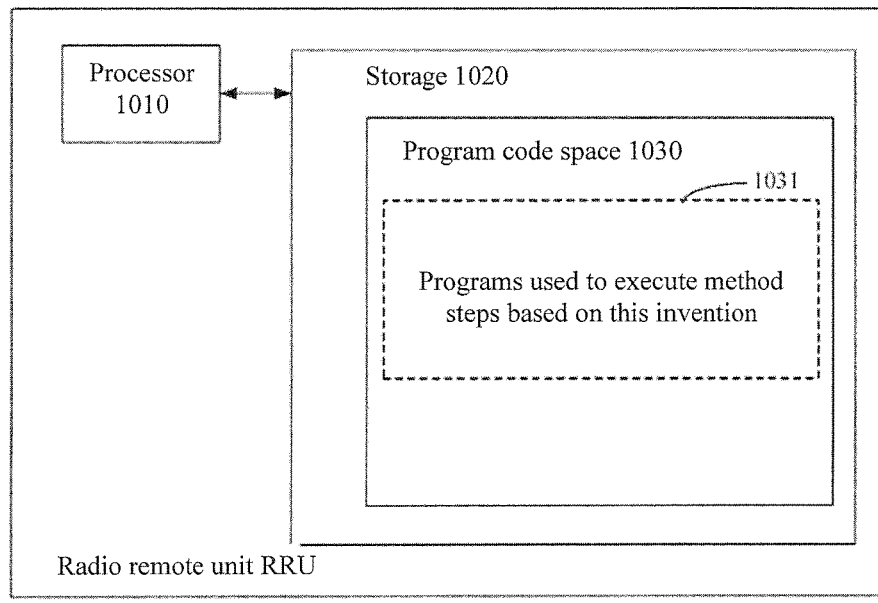
FIG. 10 is the block diagram of a RRU used to execute blocking interference suppression method based on the embodiment of this invention.
Figure 11:
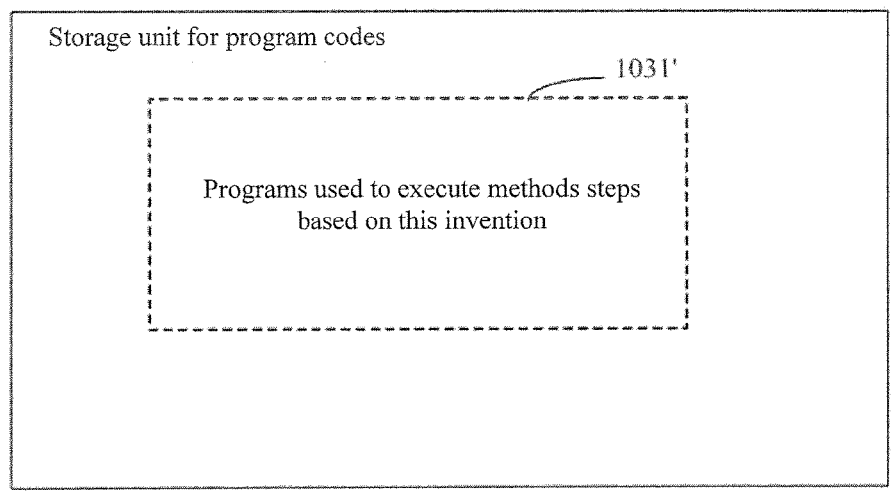
FIG. 11 is the diagram of a storage unit used to maintain or carry program codes for implementing blocking interference suppression method with RRU based on the embodiment of this invention.

FIG. 10 is the block diagram of a RRU used for performing blocking interference suppression method based on the embodiment of this invention. This RRU traditionally includes processor 1010 and computer program products or computer readable medium in the form of storage 1020. Storage 1020 can be a flash, EEPROM (electrically erasable programmable read-only memory), EPROM, hard drive, ROM, or other electronic storage device. Storage 1020 provides a storage space 1030 for executing program codes 1031 of any steps in the above method. For example, the storage space 1030 used for program codes can include individual program codes 1031 for realizing different steps in the above method. Such program codes can be read out from one or more computer program products or written into the current product or multiple computer program products. Such computer program products include program code carriers such as hard drive, compact disk (CD), storage card, or floppy disk. Such computer program products are typically portable or immobile storage units as depicted in FIG. 11. Such storage units can have storage segments and space that are similar to those in the storage 1020 of the base station in FIG. 10. The program codes can, e.g. be compressed in an appropriate form. Typically, the storage units contain computer readable codes 1031, which are codes readable to processors such as 1010. When such codes are executed by a RRU, RRU will execute different steps in the above-mentioned method.

"One embodiment", "embodiment", or "one or more embodiments" in this document means that specific features, structures, or characteristics combined with embodiment description are included in at least one embodiment of this invention. Also please note that "in one embodiment" does not necessarily refer to the same embodiment.

A blocking interference suppression method and device provided by the embodiment of this invention is described in details in the above sections. In this document, specific cases are used to illustrate principle and implementation of the embodiment of this invention. The above embodiment descriptions are only intended to help understand method and core concept of embodiments of this invention. In the meanwhile, for general technical personnel in this field, based on concepts of embodiments of this invention, both the specific implementation method and application range can be altered. In sum, this specification should not be interpreted as any restriction to embodiments of this invention.

The invention claimed is:

1. A blocking interference suppression method comprising:
   detecting, by a base band processing unit (BBU), presence of a blocking interference;
   after the BBU detects the presence of the blocking interference: sending, by the BBU, a first instruction message to a radio remote unit (RRU), the first instruction message being used to instruct the RRU to decrease an RRU receiving link gain: and
   after the BBU sends the first instruction message to the RRU:
      detecting, by the BBU, that the blocking interference has been eliminated; and
      sending, by the BBU, second instruction message to the RRU, the second instruction message being used to instruct the RRU to change the receiving link gain to a default value, wherein the detecting, by the BBU, that the blocking interference has been eliminated includes in a predefined detection cycle, if an average value of uplink signal power detected by the BBU at each transmission time interval (TTI) moment is constantly lower than or equal to a predefined uplink receiving power upper threshold, and the uplink interference over thermal (IOT) is constantly lower than or equal to a predefined IOT lower threshold, determining, by the BBU, that the blocking interference has been eliminated.

2. The method according to claim 1, wherein the detection of the blocking interference by the BBU includes:
   in the predefined detection cycle, if the average value of the uplink signal power detected by the BBU at each TTI moment is constantly higher than or equal to a predefined uplink receiving power upper threshold, and the uplink IOT is constantly higher than or equal to a predefined IOT upper threshold, the BBU determines presence of blocking interference.

3. The method according to claim 1, wherein the first instruction message also includes a power attenuation parameter used to instruct the RRU to decrease the receiving link gain.

4. The method according to claim 1, further comprising:
   before the BBU sends the first instruction message to RRU:
      determining, by the BBU, whether an accumulated decrease of receiving link gain of the RRU is lower than a predefined maximum adjustment.

5. A blocking interference suppression method. comprising:
   receiving, by a radio remote unit (RRU) a first instruction message from a base band processing unit (BBU), the first instruction message being sent after the BBU detects presence of blocking interference:
   decreasing, by the RRU, the RRU receiving link gain;
   receiving, by the RRU, a second instruction message from the BBU, the second instruction message being sent after the BBU sends the first instructions message and subsequently detects that the blocking interference has been eliminated; and
   changing, by the RRU, the receiving link gain to a default value, wherein the BBU detecting the blocking interference has been eliminated includes: in a predefined detection cycle, if an average value of uplink signal power detected by the BBU at each transmission time interval(TTI) moment is constantly lower than or equal to a predefined uplink receiving power upper threshold, and the uplink interference over thermal (IOT) is constantly lower than or equal to a predefined IOT lower threshold, determining, by the BBU, that the blocking interference has been eliminated.

6. The method according to claim 5 wherein the first instruction message also includes a power attenuation parameter used to instruct the RRU to decrease the receiving link gain.

7. A base band processing unit (BBU) device for blocking interference suppression, the BBU device comprising:
   one or more processors configured to:
      detect presence of a blocking interference;
      after detecting the presence of the blocking interference: send a first instruction message to a radio remote unit (RRU), the first instruction message being used to instruct the RRU to decrease an RRU receiving link gain; and
      after sending the first instruction message to the RRU:
         detect that the blocking interference has been eliminated: and
         send a second instruction message to the RRU, the second instruction message being used to instruct the RRU to change the receiving link gain to a default value, wherein the detecting, by the one or more processors, that the blocking interference has been eliminated includes in a predefined detection cycle, if an average value of uplink signal power detected by the BBU at each transmission time interval (TTI) moment is constantly lower than or equal to a predefined uplink receiving power upper threshold, and the uplink interference over thermal (IOT) is constantly lower than or equal to a predefined IOT lower threshold, determining that the blocking interference has been eliminated.

8. The BBU device according to claim 7, wherein the one or more processors are further configured to: in the predefined detection cycle, if the average value of the uplink signal power detected at each TTI moment is constantly higher than or equal to a predefined uplink receiving power upper threshold, and the uplink IOT is constantly higher than or equal to a predefined IOT upper threshold, determine presence of blocking interference.

9. The BBU device according to claim 7, wherein the first instruction message also includes a power attenuation parameter used to instruct the RRU to decrease the receiving link gain.

10. The BBU device according to claim 7, wherein the one or more processors are further configured to:
    determine whether an accumulated decrease of RRU receiving link gain is lower than a predefined maximum adjustment before the first instruction message is sent to the RRU.

11. A radio remote unit (RRU) device for blocking interference suppression, the RRU device comprising:
    one or more configured to:
       receive a first instruction message from message from a base band processing unit (BBU), the first instruction message being sent after the BBU detects presence of blocking interference and
       decrease the RRU receiving link gain, wherein the BBU detecting that the blocking interference has been eliminated includes: in a predefined detection cycle, if an average value of uplink signal power detected by the BBU at each transmission time interval (TTI ) moment is constantly lower than or equal to a predefined uplink receiving power upper threshold, and the uplink interference over thermal (IOT) is constantly lower than or equal to a predefined IOT lower threshold, determining, by the BBU, that the blocking interference has been eliminated.

12. The RRU device according to claim 11, wherein the first instruction message also includes a power attenuation parameter used to instruct the RRU to decrease the receiving link gain.

13. A non-transitory computer readable medium comprising computer readable instructions that, when executed by one or more processors of the BBU, cause the one or more processors to:
   execute the blocking interference suppression method according to claim 1.

14. A non-transitory computer readable medium that, when executed by one or more processors of the RRU, cause the one or more processors to: execute the blocking interference suppression method according to claim 5.

* * * * *